(12) United States Patent
King

(10) Patent No.: US 6,300,827 B1
(45) Date of Patent: Oct. 9, 2001

(54) METHOD AND APPARATUS FOR CASCADED GROUND RETURN AMPLIFIER

(75) Inventor: Joel King, Santa Clara, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/458,226

(22) Filed: Dec. 9, 1999

(51) Int. Cl.[7] ............................... H03F 1/00; H03F 1/14; H03F 3/04
(52) U.S. Cl. ........................... 330/65; 330/292; 330/302; 330/310
(58) Field of Search ................................. 330/65, 66, 67, 330/68, 292, 302, 310

(56) References Cited

U.S. PATENT DOCUMENTS

| | | |
|---|---|---|
| 3,381,238 | 4/1968 | Barton et al. . |
| 3,413,563 | 11/1968 | Tongue . |
| 3,460,050 | 8/1969 | Hellstrom . |
| 4,348,643 | * 9/1982 | Tennyson .............................. 330/310 |
| 4,559,503 | * 12/1985 | Camand et al. ...................... 330/310 |
| 4,875,019 | * 10/1989 | Monson et al. ...................... 330/302 |
| 5,015,968 | * 5/1991 | Podell et al. ......................... 330/302 |
| 5,623,231 | * 4/1997 | Mohwinkel et al. ................ 330/307 |

OTHER PUBLICATIONS

Design For Emi, Application Note Ap–589; Intel Order No.: 243334–002; Feb. 1999; Intel Corporation.
Slot 1 Prcessor Power Distribution Guidelines, Application Note Ap–587; Intel Order No.: 243332–002; Aug. 1998; Intel Corporation.
Maintaining Clean Power, Design Note; ULtraCAD Design, Inc.; 1995.
Lindsey, Darryl; The Design & Drafting of Printed Circuits; 1984; pp 233–238, 314–315; Bishop Graphics, Inc., Westlake Village, CA.
Hockanson, David & Nuebel, Joe; Report on the Efficacy of Split Groundplanes as an EMI Deterrent; Feb. 19, 1997; Electromagnetic Compatibility Labortary, Department of Electrical Engineering, University of Missouri–Rolla.

(List continued on next page.)

Primary Examiner—Robert Pascal
Assistant Examiner—Patricia Nguyen
(74) Attorney, Agent, or Firm—Blakely, Sokoloff, Taylor & Zafman LLP

(57) ABSTRACT

A cascaded amplifier is integrated within an integrated circuit with a cascaded ground bus. The cascaded ground bus provides two ground points at opposite ends. Each amplifier ground of each amplifier stage couples to the ground wire there between. The cascaded ground bus substantially reduces the parasitic inductance in the emitter leg of each IC transistor within each amplifier. The lay out of the cascaded ground bus wire is tightly coupled to the lay out of the input wires so that their respective parasitic inductances are magnetically coupled together to form a mutual inductance. The mutual inductance effectively cancels the effect of the ground return inductance due to them being similar inductance values and having the same ground loop current flowing through them in opposite directions. The cascaded ground bus can be utilized in substantially all amplifier types including class A, B, C, D, BD, E, F, G, H, S and their variations and with substantially all transistor types used within amplifier stages including bipolar junction transistors, field effect transistors and their variants (i.e. PNP, NPN, MOSFET, NFET, PFET, JFET, MESFET, etc.). An IC cascaded amplifier with the cascaded ground bus can be utilized in a number of communication systems where amplification is needed including battery operated systems such as a transceiver of a portable cellular telephone.

35 Claims, 6 Drawing Sheets

OTHER PUBLICATIONS

King, Joel; An Integrated 150mW CMOS Power Amplifier; A Master's Report; Electrical Engineering and Computer Science, Graduate Division, University of California at Berkeley.

Larson, Lawrence; RF and Microwave Circuit Design for Wireless Communications; Mobile Comunications Series; 1996 pp. 391–393; Artech House Inc. Norwood, MA.

Dorf, Richard; Grounding, Shielding, and Filtering; The Electrical Engneering Handbook; 1993; Chapter 38, pp. 903–906; CRC Press, Inc., Boca Raton, Florida.

Fact Advanced CMOS Logic Databook; National Semiconductor; Fact Databook 1990 Edition p 3–3–3–17.

G.M. Krylov; A Selective Amplifier with a Regulated Load; Radiotekhnika; No. 11; 1987; pp 92–93.

Brian Hughes, Jerry Orr and Glenn Martin; MMIC 20 GHz Low–Noise and 44 GHz Power Amplifiers for Phased Array Communication Antennas Designed for Manufacturability; GaAs IC Symposium; pp 367–370; 1993 IEE.

\* cited by examiner

METHOD AND APPARATUS FOR CASCADED GROUND RETURN AMPLIFIER

FIELD OF THE INVENTION

This invention relates generally to amplifiers. More particularly, the invention relates to grounding a cascaded series of amplifiers in an integrated circuit.

BACKGROUND OF THE INVENTION

In the transmission of electromagnetic radiation over antennae, amplification is usually necessary to achieve sufficient power to transmit signals by radiating an electromagnetic field. Similarly to receive signals, low level electromagnetic fields need to be amplified to sufficient power levels for circuitry to discern the received signal. The electromagnetic fields may be radiated at various frequencies but typically are associated with radio or microwave frequency ranges. In any case, it is desirable to provide efficient amplification of signals. Efficient amplification is proportional to the gain provided by an amplifier. Thus, it is desirable to increase both the gain and efficiency in the design of amplifiers used to amplify signals.

Prior art high frequency amplifiers typically use discrete components such as discrete capacitors, discrete inductors and discrete transistors because of they are easy to change out or modify if improperly designed or manufactured and are they are relatively inexpensive. Referring now to FIG. 1A, a discrete transistor 100A is illustrated. Discrete transistor 100A is in a packaged form and includes a single transistor circuit on a semiconductor die 102. The base collector and emitter of the discrete transistor 100A are output respectively on the base pin 104, the collector pin 105, and the emitter pin 106. The base pin 104 is coupled to the base of the discrete transistor 100A through the base bond wire 107 and the base bonding pad 110. The collector pin 105 couples to the collector of the discrete transistor 100A through the collector bonding wire 108 and the collector bonding pad 111. The emitter pin 106 couples to the emitter of the discrete transistor 100A through the emitter bonding wire 109 and the emitter bonding pad 112. Referring now to FIG. 1B, a schematic diagram symbol of the idealized discrete transistor 100B is illustrated. Discrete transistor 100B includes the base pin 104, the collector pin 105 and the emitter pin 106. Referring now to FIG. 1C, a schematic diagram of the discrete transistor 100C including parasitic elements is illustrated. In FIG. 1C, discrete transistor Q is illustrated including the parasitic elements associated with the discrete transistor 100A. Discrete transistor 100A has inherent parasitics due to the metal wire routing from each transistor terminal to the bonding pads which are represented by the base inductance $L_b$, the collector inductance $L_c$, and the emitter inductance $L_e$. Inherent in the manufacturing of a transistor are capacitances between terminals. Between the base and collector is a base-collector capacitance $C_{bc}$. Between the base and emitter there is a base-emitter capacitance $C_{be}$. Between the collector and emitter is a collector emitter-capacitance $C_{ce}$. These transistor parasitics are associated with semiconductor physics and the design and manufacture of the transistor in the semiconductor die 102. Parasitic inductances are also associated with the bonding wires 107–109 connected between the bonding pads and the pins 104–106 and the pins themselves. These parasitic inductances from the bonding wires and pins are represented in FIG. 1C as the base bond wire inductance $L_{bwb}$, the collector bond wire inductance $L_{bwc}$, and the emitter bond wire inductance $L_{bwe}$. In the preferred embodiment, transistor Q of discrete transistor 102 is designed and manufactured for the amplification of radio frequency signals. Alternatively, transistor Q may be designed and manufactured to operate within other ranges of transmission carrier frequencies.

Referring now to FIG. 2A, a block diagram symbol of a single-stage amplifier 200 is illustrated. Amplifier 200 is provided with a power supply input through amplifier ground AG. Signals input on the amplifier input $A_{IN}$ are amplified by a gain to generate the amplifier output $A_{out}$. Referring now to FIG. 2B, a typical schematic diagram of the single-stage amplifier 200 is illustrated. The single stage amplifier 200 is illustrated with the idealized discrete transistor 100 of FIG. 1B. The amplifier input $A_{IN}$ is coupled into the base of the discrete transistor 100 through the blocking capacitor $C_{block}$. Amplifier ground AG is directly coupled preferably to the emitter 106 of the discrete transistor 100. However, amplifier ground AG is not directly coupled into the emitter of transistor Q because of the parasitic inductance associated with the emitter and the package connections including a bond wire and the connecting pin itself. The amplifier output $A_{out}$ is provided at the collector 105 of the discrete transistor 100.

Often times a single amplifier stage is insufficient to provide a sufficient amount of amplification. In order to provide greater amplification, two or more single amplifier stages may be coupled in series together to form a cascaded amplifier. Referring now to FIG. 3A, a block diagram of a cascaded amplifier 300A is illustrated, having N single amplifier stages. Cascaded amplifier input Cin is input into the cascaded amplifier 300A to generate the cascaded amplifier output Cout. The single amplifier stage, having the discrete transistor 100 illustrated in FIG. 2B is exemplary of each of the instances of amplifiers $A_1$ through $A_n$. Typically the cascaded amplifier 300A is implemented in a printed circuit board. Each of the amplifier stages are coupled in series together through the use of metallic printed circuit board traces. Except for the last stage, the output from one stage is coupled to the input of the next respective stage. The printed circuit board typically has a power supply provide the board power BP and board ground BG through their respective metal traces. Each of the discrete amplifiers are typically separately coupled to the board power BP and the board ground BG. The separate power coupling through the metal traces forms parasitic inductive components. Between amplifier power AP and board power BP there is a power trace inductance $L_{PT1}$ through $L_{PTn}$. Similarly, parasitic inductance is formed through the metal trace between the amplifier ground AG and the board ground BG as represented by the ground trace inductances $L_{gt1}$ through $L_{gtn}$. Each of the amplifier stages has an input inductance associated with the input wire trace of the printed circuit board. These are represented by the input trace inductances $L_{IT1}$ through $L_{ITn}$. A trace output inductance $L_{outT}$ is also associated with the final output from the amplifier stage $A_n$. Because the ground traces are typically connected to the same board ground BG, AC ground loop currents are formed in the inductances $L_{GT1}$ through $L_{GTn}$ when the amplifier is operating to amplify AC signals. In FIG. 3A, the AC ground loop currents $i_1$ through $i_3$ are illustrated. Because of the AC ground loop currents, the actual ground voltage provided to the amplifiers $A_1$ through $A_n$, is actually elevated above zero volts when amplification occurs. This causes a degradation in the amplification provided by each of the amplifiers $A_1$ through $A_n$ when the ground coupled at each respective emitter rises.

Alternatively components of a cascaded amplifier may be implemented within an integrated circuit device. Referring now to FIG. 3B, a packaged integrated circuit 300B for a four stage integrated circuit cascade amplifier 300C is illustrated. The packaged integrated circuit 300B has pins 304, 305–305D, 306–306D which connect using bondwires to the die of the four stage integrated circuit cascaded amplifier 300C. Referring now to FIG. 3C, the integrated circuit 300C includes transistors Q1, Q2, Q3, and Q4 and blocking capactors $C_{B1}$, $C_{B2}$, $C_{B3}$, and $C_{B4}$. The other elements illustrated in the schematic of FIG. 3C are parasitic components associated with packaging and manufacturing of the integrated circuit. The packaged integrated circuit 300B does not include the pullup inductance $L_{PU}$ illustrated in FIG. 2B at each collector of each amplifier stage. The pullup inductance $L_{PU}$ in the case of the packaged integrated circuit 300B is externally connected. Each bipolar junction transistor has a base to collector capacitance $C_{BC1}$–$C_{BC4}$ respectively while other parasitic capacitances associated with the transistor are ignored because they have minimal effect. To each connection of the transistor, there is an inductance associated with the metal wire routing on the integrated circuit. In each emitter leg of each bipolar junction transistor, there is inductance $L_{E1}$, $L_{E2}$, $L_{E3}$, and $L_{E4}$ respectively associated with the metal wire routing on the integrated circuit. In each collector leg of each bipolar junction transistor, there is inductance $L_{C1}$, $L_{C2}$, $L_{C3}$, and $L_{C4}$ respectively associated with the metal wire routing on the integrated circuit. In each of the base leg of each bipolar junction transistor there is inductance $L_{B1}$, $L_{B2}$, $L_{B3}$, $L_{B4}$ respectively from the metal wire routing on the integrated circuit. To connect the integrated circuit to a printed circuit board there are bondwires 307, 306A–306D, and 308–308D and their respective pinouts each having a parasitic bond wire inductance associated with them. For the connection to the base of transistor Q1 there is the bond wire/pin-out inductance $L_{BWB1}$. For the connection to the collectors of each transistor there are the bond wire/pin-out inductances $L_{BCW1}$, $L_{BWC2}$, $L_{BWC3}$, and $L_{BWC4}$ respectively. For the connection to the emitters of each transistor there are the bond wire/pin-out inductances $L_{BWE1}$, $L_{BWE2}$, $L_{BWE3}$, and $L_{BWE4}$ respectively. The integration of the cascasded amplifier into integrated circuit 300B provides little reduction of parasitic inductances. Only the bondwire/pinout inductance between collector to base connections of the discrete device cascaded amplifier has been eliminated. The four emitters of the four stage integrated circuit cascade amplifier 300B retain their parasitic inductances ($L_{E1}$ and $L_{BWE1}$, $L_{E2}$ and $L_{BWE2}$, $L_{E3}$ and $L_{BWE3}$, $L_{E4}$ and $L_{BWE4}$) through each separate connection to board ground through pin VSS1 306A, pin VSS2 306B, pin VSS3 306C, and pin VSS4 306D respectively. Additionally, the four collectors of the four stage integrated circuit cascade amplifier 300B retain their parascitic inductances through their respective separate connections C1 305A, C2 305B, C3 305C, and Cout 305D respectively. Otherwise, the integrated circuit 300B is similar to the discrete cascade amplifer 300A.

Referring now to FIG. 4, a more detailed schematic diagram of the first three amplifier stages of the cascaded amplifier of FIG. 3A is illustrated. In FIG. 4, each of the amplifiers $A_1$ through $A_3$ have been replaced with their schematic transistor representation of FIG. 2B. Transistor Q1, blocking capacitor $C_{B1}$, base-collector capacitance $C_{BC1}$, emitter inductance $L_{E1}$, and emitter bond wire inductance $L_{BWE1}$ are associated with amplifier A1. Transistor Q2, blocking capacitor $C_{B2}$, base-collector capacitance $C_{BC2}$, emitter inductance $L_{E2}$, and emitter bond wire inductance $L_{BWE2}$ are associated with amplifier A2. Transistor Q3, blocking capacitor $C_{B3}$, base-collector capacitance $C_{BC3}$, emitter inductance $L_{E3}$, and emitter bond wire inductance $L_{BWE3}$ are associated with amplifier A3. FIG. 4 illustrates the more relevant parasitic values associated with the cascaded amplifier while those of insignificance are lumped together to the relevant parasitic values so as not to obscure details of the present invention. The bias resistor RBIAS for each amplifier is also not shown in FIG. 4. The base inductance $L_B$ is insignificant when compared with the base bond wire inductance $L_{BWB}$ and the input trace inductance $L_{IT}$. Additionally, the base current into the base is of a sufficiently low enough value such that all the inductance can be lumped together into $L_{IT}$, where $L_{IT}'=L_{IT}+L_{BWB+LB}$. In FIG. 4, inductance $L_{IT1}'$ through $L_{IT3}'$ is coupled to the respective base of each transistor amplifier stage. The collector inductance $L_c$ and the collector bond wire inductance $L_{BWC}$ is insignificant when compared with the pull up inductor $L_{PU}$. Thus, the collector inductance can be lumped together as LPU' where $L_{PU}'=L_{PU}+L_{BWC+LC}$. FIG. 4 shows the first three amplifier stages with $L_{PU1}'$ through $L_{UP3}'$. The inductance between the emitter and board ground BG in the emitter leg, is the emitter inductance $L_E$, the emitter bond wire inductance $L_{BWE}$ and the ground trace inductance $L_{GT}$. This inductance is often times referred to as a degeneration inductance. In FIG. 4 ground loop current $i_1$ flows out of the emitter of transistor Q2 towards ground through inductance $L_{E2}$, inductance $L_{BWE2}$, inductance $L_{G2T}$, back towards transistor Q1 through inductance $L_{GT1}$, inductance $L_{BWE1}$, inductance $L_{E1}$ into the emitter and out the collector of transistor Q1, and forwards towards transistor Q2 through inductance $L_{IT2}'$, capacitance $C_{B2}$ and into the base and out the emitter of transistor Q2. Ground current loop $i_2$ circulates similarly through the components and transistors of the ground current loop between transistors Q2 and Q3. Both ground loop currents $i_1$ and $i_2$ flow through the sum of the inductances of $L_{E2}$, $L_{BWE2}$, and $L_{GT2}$ in the emitter leg of transistor Q2. This common inductance between the current loops $i_1$ and $i_2$ is referred to as the common ground inductance $L_{common}$. A ground return inductance, $L_{return}$, is the inductance seen in the ground path by the input ground current loop $i_1$. The ground return inductance with respect to current $i_1$ is the sum of the inductance in the prior emitter leg ($L_{E1}$, $L_{BWE1}$, $L_{GT1}$ of amplifier $A_1$). The common ground inductance $L_{common}$ and the ground return inductance $L_{return}$ are parasitic inductances associated with the cascaded amplifier. Because both ground loop currents $i_1$ and $i_2$ flow through the common ground inductance $L_{common}$ found in the emitter leg of transistor Q2, an elevated voltage above ground may be provided to the emitter of the transistor. This can result in reduced base-emitter control voltage $V_{be}$ such that less amplification is provided by the transistor. From these two ground loop currents, the amplifier power $A_p$ provided by a single stage discrete transistor amplifier can be approximated by the equation for $A_p$.

$$A_p \approx \frac{1}{\left[\omega L_{common} + \left(\frac{\omega L_{return}}{B_{ac}}\right)\right] \times \omega C_{BC}}. \qquad (EQ.\ 1).$$

In the case of analyzing $A_p$ for amplifier stage 2, $$L_{common}=L_{E2}+L_{BWE2}+L_{GT2} \text{ and } L_{return} \approx L_{E1}+L_{BWE1}+L_{GT1} \quad (EQ.\ 2).$$

In the equation for amplifier power $A_p$, $\omega$ is the frequency in radians where $\omega=2\pi f$, $B_{ac}$ is the AC Beta of the transistor and $B_{ac}=i_{out}/i_{in}$, $L_{common}$ is the sum of inductances in the emitter leg (in the case of amplifier $A_2$ this is $L_{E2}$, $L_{BWE2}$, and $L_{GT2}$) while the $L_{return}$ is approximated by the sum of the inductance in the prior emitter leg ($L_{E1}$, $L_{BWE1}$, $L_{GT1}$ of amplifier $A_1$). Thus, the inductance between the emitter and board ground BG in the emitter leg of the transistor has a significant impact on the gain of a single amplifier stage.

The parasitic inductance in each emitter leg decreases the gain of each respective amplifier stage. The decrease in gain of each amplifier stage decreases the overall efficiency of the power amplifier. The total power efficiency $\theta_{Total}$ of a five stage cascaded amplifier may be approximated by using EQ. 3.

$$\frac{1}{\eta_{Total}} = \frac{1}{\eta_5} + \frac{1}{G_5\eta_4} + \frac{1}{G_5G_4\eta_3} + \frac{1}{G_5G_4G_3\eta_2} + \frac{1}{G_5G_4G_3G_2\eta_1} \quad \text{(EQ. 3)}.$$

In EQ. 3, $\theta_n$ is the efficiency of each respective numbered amplifier stage where n varies from 1 through 5. From this equation it can be seen that if inductance in the emitter legs of the amplifier stages reduces the gain of the respective stage, the efficiency of the cascaded amplifier will be reduced. Efficiency of amplifiers is particularly important in battery operated systems, such as cellular telephones, to increase the lifetime of the battery or the period between charging a rechargeable battery. Therefore, it is desirable to reduce or eliminate the inductance in the emitter leg of the transistor in each amplifier stage in order to improve the gain and power efficiency of a cascaded series of amplifiers,

BRIEF SUMMARY OF THE INVENTION

Briefly, the present invention includes a method, apparatus and system as described in the claims. A cascaded amplifier is integrated within an integrated circuit with a cascaded ground bus. The cascaded ground bus has two ground points at opposite ends of the integrated circuit with each cascaded amplifier having its amplifier ground terminal coupled between them. The cascaded ground bus substantially reduces the parasitic inductance within each amplifier. The parasitic inductance for each amplifier includes a common ground inductance $L_{common}$ and a ground return inductance $L_{return}$. The cascaded ground bus effectively splits a ground loop current on the integrated circuit chip, at the connection to the cascaded ground bus, into two current loops substantially reducing the common ground inductance $L_{common}$. The cascaded ground bus is laid out with the input wires of each amplifier stage within the IC so as to have its parasitic ground wire inductance magnetically coupled in a substantial manner to form a mutual inductance with the input wire inductance. The input wire inductance and the ground wire inductance are in the same ground loop and have the same ground loop current flowing through them but in opposite directions. The ground wire and input wire are laid out similarly such that the ground wire inductance and the input wire inductance are of substantially similar values. Because of substantially similar inductance values and the magnetic coupling between the ground wire and input wire forming a mutual inductance, the same ground loop current flowing through the inductances but in opposite directions tends to substantially cancel the ground return inductance of each amplifier stage.

The cascaded ground bus can be utilized in substantially all amplifier types including class A, B, C, D, BD, E, F, G, H, S and their variations and with substantially all transistor types used within amplifier stages including bipolar junction transistors, field effect transistors and their variants (i.e. PNP, NPN, MOSFET, NFET, PFET, JFET, MESFET, etc.). An IC cascaded amplifier with the cascaded ground bus can be utilized in a number of communication systems where amplification is needed including battery operated systems such as a transceiver of a portable cellular telephone.

BRIEF DESCRIPTIONS OF THE DRAWINGS

Like reference numbers and designations in the drawings indicate like elements providing similar functionality.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

A cascaded amplifier is integrated within an integrated circuit with a cascaded ground bus. The cascaded ground bus has two ground points at opposite ends of the integrated circuit with each cascaded amplifier coupled between them. The cascaded ground bus substantially reduces the parasitic inductance within each amplifier. The parasitic inductance for each amplifier includes a common ground inductance $L_{common}$ and a ground return inductance $L_{return}$. The cascaded ground bus effectively splits a ground loop current on the integrated circuit chip, at the connection to the cascaded ground bus, into two current loops substantially reducing the common ground inductance $L_{common}$. The cascaded ground bus is laid out with the input wires of each amplifier stage within the IC so as to have its parasitic ground wire inductance magnetically coupled in a substantial manner to form a mutual inductance with the input wire inductance.

The input wire inductance and the ground wire inductance are in the same ground loop and have the same ground loop current flowing through them but in opposite directions. The ground wire and input wire are laid out similarly such that the ground wire inductance and the input wire inductance are of substantially similar values. Because of substantially similar inductance values and the magnetic coupling between the ground wire and input wire forming a mutual inductance, the same ground loop current flowing through the inductances but in opposite directions tends to substantially cancel the ground return inductance of each amplifier stage.

The cascaded ground bus can be utilized in substantially all amplifier types including class A, B, C, D, BD, E, F, G, H, S and their variations and with substantially all transistor types used within amplifier stages including bipolar junction transistors, field effect transistors and their variants (i.e. PNP, NPN, MOSFET, NFET, PFET, JFET, MESFET, etc.). An IC cascaded amplifier with the cascaded ground bus can be utilized in a number of communication systems where amplification is needed including battery operated systems such as a transceiver of a portable cellular telephone.

Figure 5:
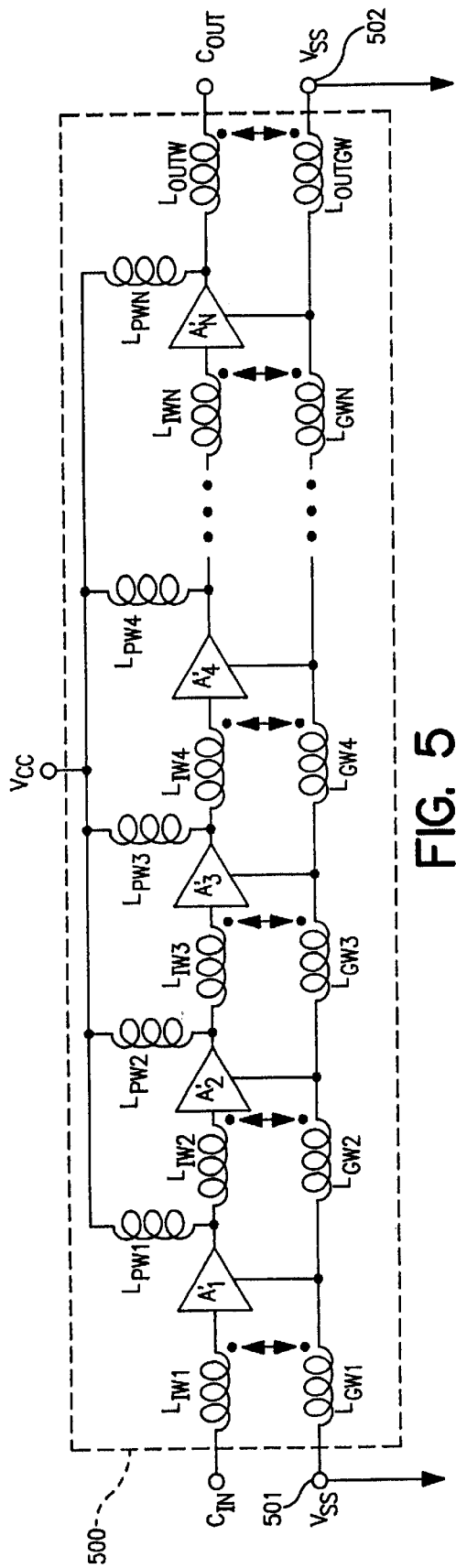
FIG. 5 is a block diagram of an integrated circuit (IC) cascaded amplifier with the cascaded ground of the present invention.

Referring now to FIG. 5, the block diagram of an integrated circuit cascaded amplifier 500 with the cascaded ground bus of the present invention is illustrated. Cascaded amplifier 500 includes N amplifier stages, amplifier $A_1'$ through amplifier $A_n'$, coupled in series together as shown (the output of one stage coupled to the input of the next) in order to amplify an input signal on the cascade input Cin into the output signal on the cascaded output Cout. Instead of each individual amplifier being connected to board ground BG, a cascaded ground bus is provided in the integrated circuit which couples to each amplifier ground AG of each amplifier stage of the cascaded amplifier 500. The cascaded ground bus connects to board ground provided on a printed circuit board through two separate VSS pins, VSS 501 and VSS 502, at each end of the cascaded ground bus. The amplifier ground AG of each of the N amplifier stages, amplifier $A_1'$ through amplifier $A_n'$, is coupled to the cascaded ground bus between the two separate VSS pins. The coupling of the N amplifier stages to the cascaded ground bus between VSS 501 and VSS 502 forms a series of parasitic inductances associated with the ground wire routing on the integrated circuit. The value of the parasitic inductances in wire routing can be determined from transmission line inductance equations knowing the geometry (thickness, width, and length) of the wire routing and the properties of the metallic material. The parasitic inductances of the ground wire routing and the input wire routing of each stage are generally referred to by the reference designation $L_{GW}$ and $L_{IW}$. The ground wire routing inductances between each stage are labeled $L_{GW1}$ through $L_{outGW}$ in FIG. 5. At the input to each of the amplifier stages $A_1'$ through $A_n'$ are the parasitic input wire inductances $L_{IW1}$ through $L_{IWn}$. Associated with the output from the cascaded amplifier 500 is the parasitic output inductance $L_{outW}$. Connecting the cascaded ground bus between VSS 501 and VSS 502 allows the ground loop current of each stage of the cascaded amplifier to be split between the terminals of VSS 501 and VSS 502. Integrating the cascaded amplifier 500 into an integrated circuit removes the bond wires and their associated inductances away from the transistor, including the emitter bond wire inductance $L_{BWE}$ or similar connection to board ground BG. Each input wire routing and ground wire routing between each amplifier stage are laid out on the integrated circuit substantially close and parallel to one another without touching such that there is a substantial magnetic coupling between them to form a mutual inductance. For example, input wiring to amplifier $A_1'$ having inductance $L_{IW1}$ is routed such that it is magnetically coupled to the inductance of the ground wire $L_{GW1}$. Similarly, at the input to the amplifier $A_2'$ the input wire inductance $L_{IW2}$ is magnetically coupled to the ground wire inductance $L_{GW2}$. At the output of the final stage of the cascaded amplifier 500, amplifier $A_n'$ has the output inductance $L_{outW}$ magnetically coupled to the ground wire inductance $L_{OutGw}$. By laying out the input wire routings and the ground wire routings in this fashion there is substantial magnetic coupling between the parasitic inductances to form a mutual inductance. In addition, the input wire and ground wire routings are laid out between each stage so as to further reduce the parasitic inductance values of $L_{GW}$ and $L_{IT}$. This is typically done by substantially increasing the widths of the metal routes wherever possible to reduce the incremental inductance. In the case that other transistor types are used in the amplifier, similar parasitics are found in the terminal legs of each transistor.

Figure 1C:
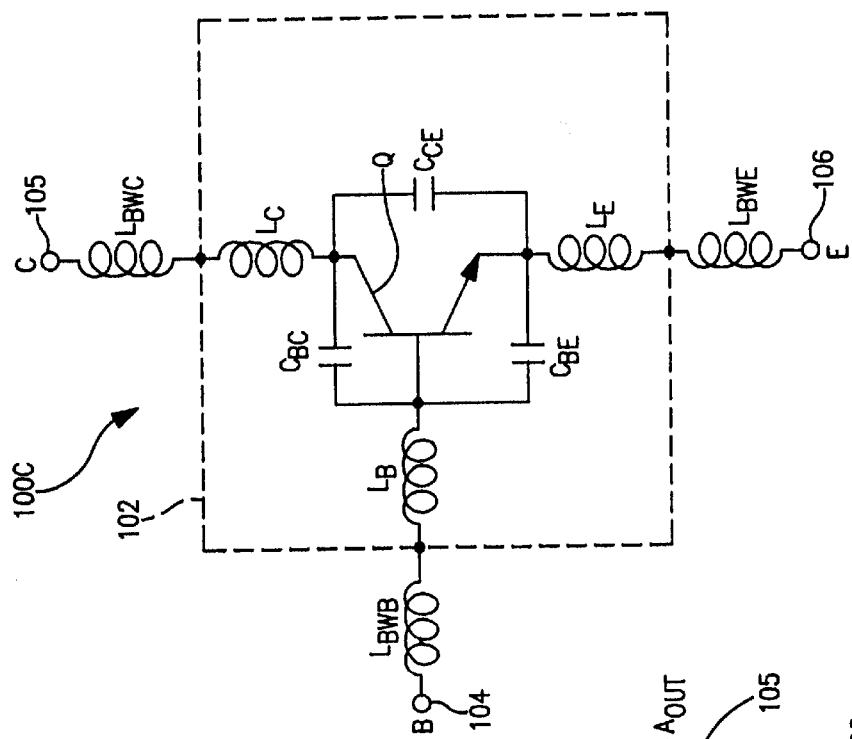
FIG. 1C is a schematic diagram of a discrete transistor including parasitic elements.
Figure 1B:
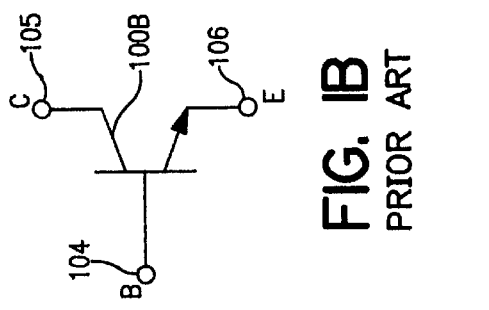
FIG. 1B is a schematic diagram symbol of the idealized discrete transistor.
Figure 1A:
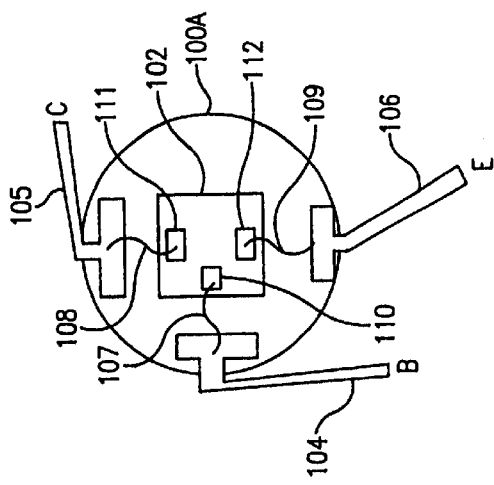
FIG. 1A is a top cutaway view of a discrete transistor.
Figure 2B:
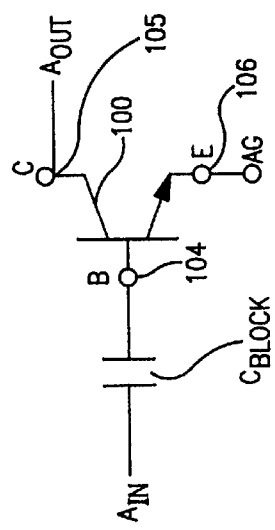
FIG. 2B is an exemplary schematic diagram of the single stage amplifier of FIG. 2A incorporating the idealized discrete transistor of FIG. 1B.
Figure 2A:
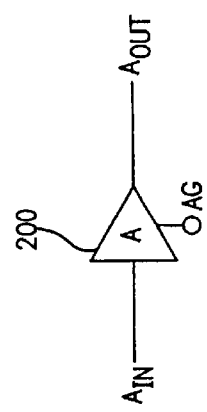
FIG. 2A is block diagram of a single stage amplifier.
Figure 3A:
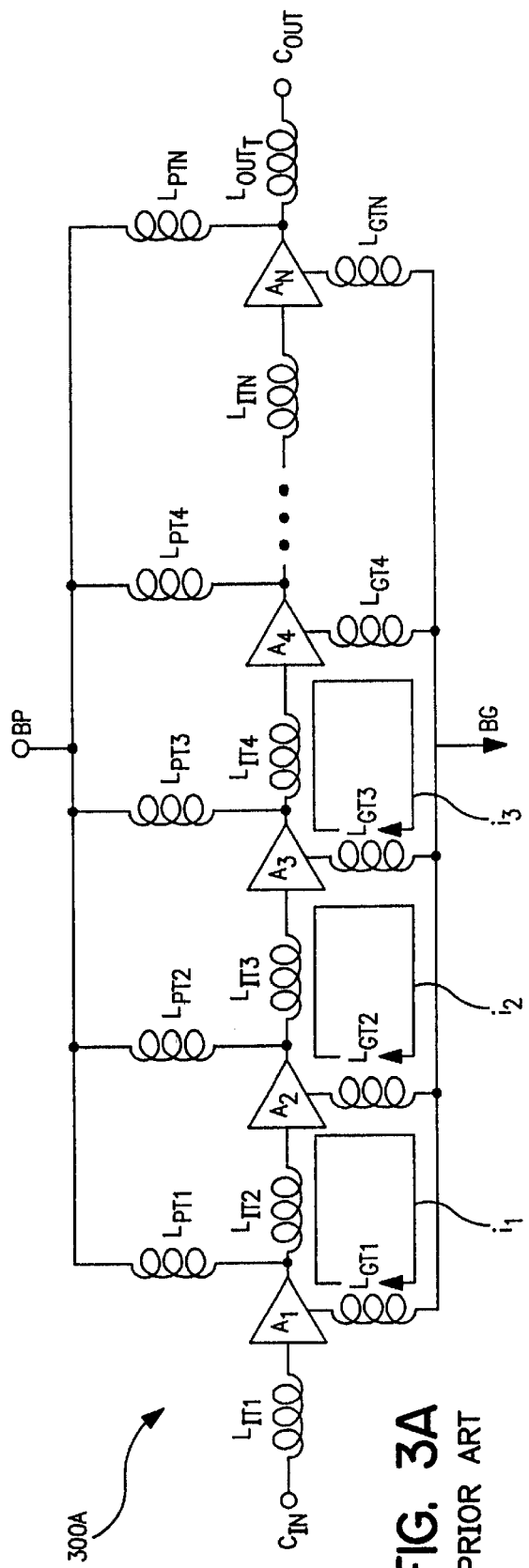
FIG. 3A is a block diagram of a discrete device cascaded amplifier.
Figure 3B:
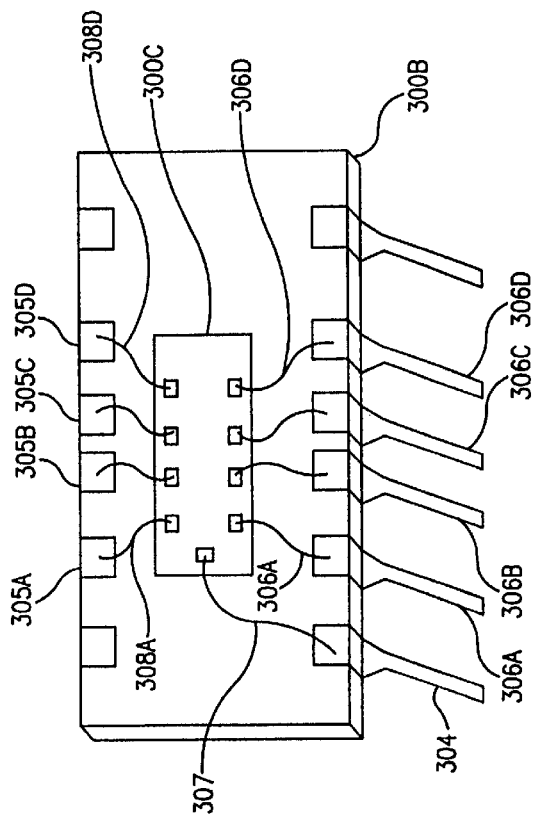
FIG. 3B is a perspective view of a integrated circuit for a four stage cascaded amplifier.
Figure 3C:
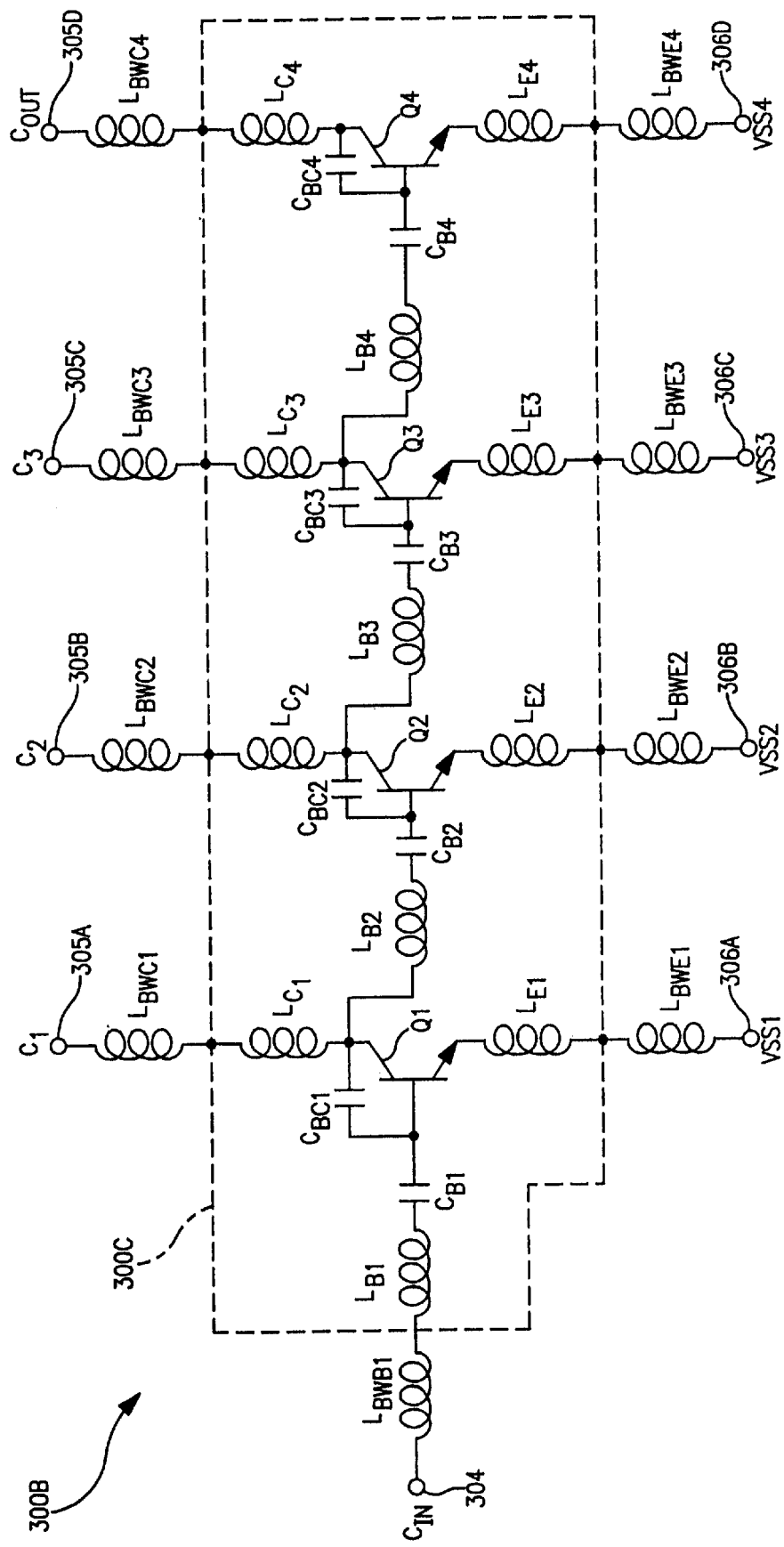
FIG. 3C is a simplified schematice diagram of the integrated circuit of FIG. 3B.
Figure 4:
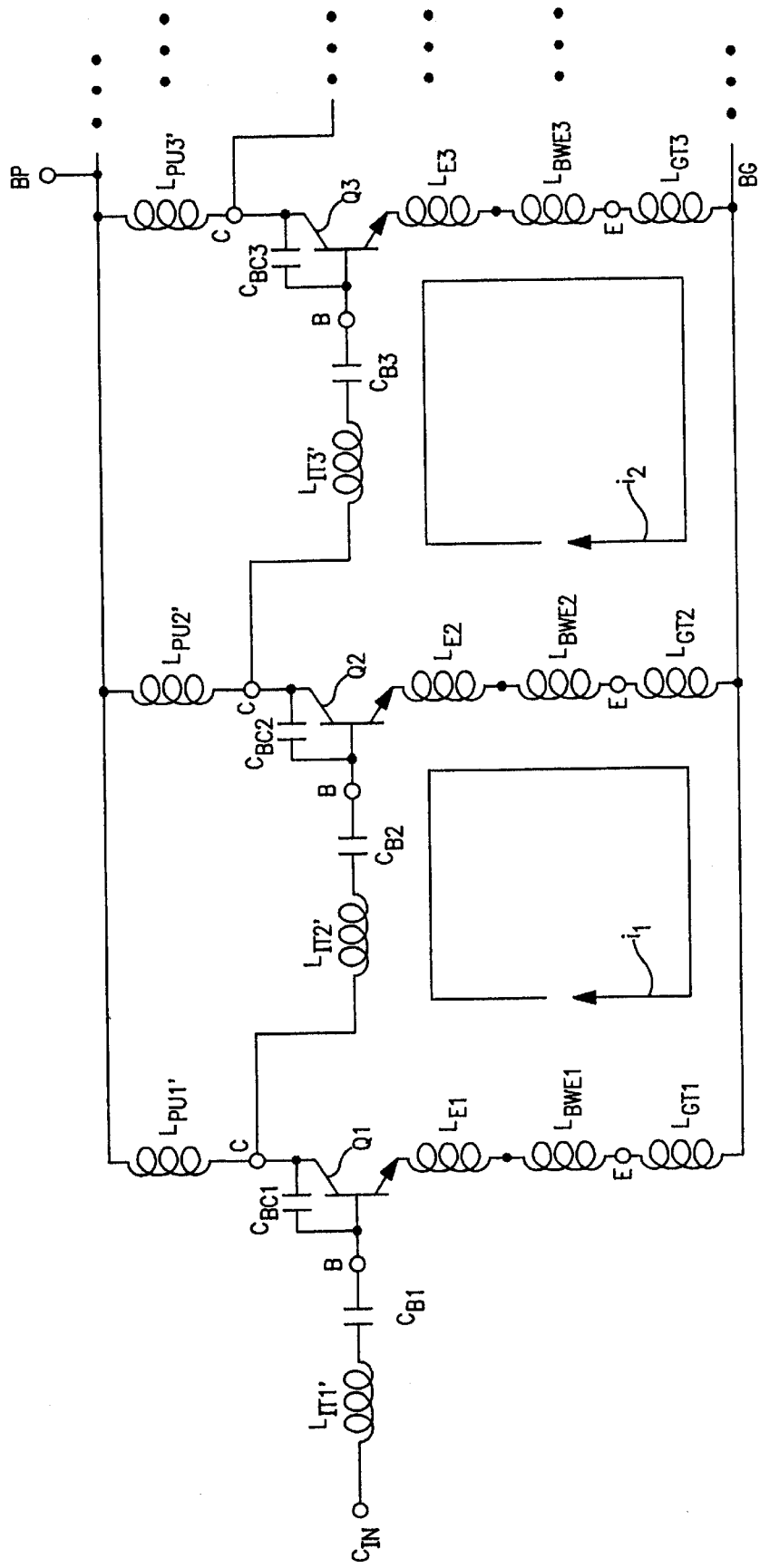
FIG. 4 is a simplified schematic diagram of three amplifier stages of the cascaded amplifier of FIG. 3A.
Figure 6:
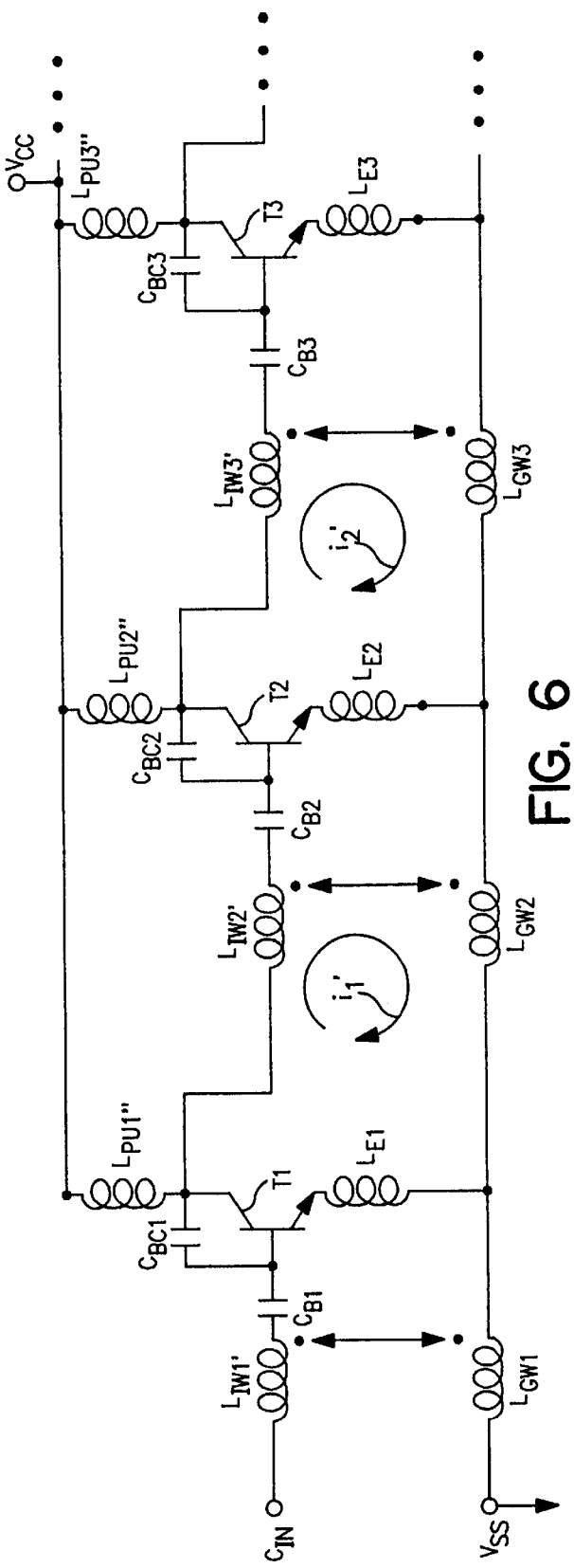
FIG. 6 is a simplified schematic diagram of three amplifier stages of the IC cascaded amplifier of FIG. 5 having the cascaded ground of the present invention.

Referring now to FIG. 6, a schematic diagram of three amplifier stages, $A_1'$ through $A_3'$, are illustrated with simplified parasitic inductances. Transistor T1, blocking capacitor $C_{B1}$, emitter inductance $L_{E1}$, base-collector capacitor $C_{BC1}$ and inductor $L_{PU1}''$ are associated with amplifier $A_1'$. Transistor T2, blocking capacitor $C_{B2}$, emitter inductance $L_{E2}$, base-collector capacitor $C_{BC2}$ and inductor $L_{PU2}''$ are associated with amplifier $A_2'$. Transistor T3, blocking capacitor $C_{B3}$, emitter inductance $L_{E3}$, base-collector capacitor $C_{BC3}$ and inductor $L_{PU3}''$ are associated with amplifier $A_3'$, respectively. Integrating the cascaded amplifier 500 into an integrated circuit (IC) eliminates the bond wire inductances $L_{BW}$ from the emitter leg of each stage. In addition, parasitic inductance can be substantially cancelled. The cascaded amplifier 500 has AC ground current loops formed in each amplifier stage such as ground current loops $i_1'$ and $i_2'$. The ground current loop $i_1'$ flows from the emitter of transistor T2 through emitter inductance $L_{E2}$, ground wire inductance $L_{GW2}$, emitter inductance $L_{E1}$ into the emitter and out the collector of transistor T1, through the input wire inductance $L_{IW2}'$, the blocking capacitor $C_{B2}$, and into the base and out the emitter of transistor T2. Ground loop current $i_2'$ circulates similarly through the components and transistors of the ground current loop between transistor T2 and T3. The AC ground loop currents $i_1'$ and $i_2'$ need only flow through the common ground inductance of $L_{E2}$ in the emitter leg of transistor T2 which is significantly negligent as compared to the common ground inductance of FIG. 4. Currents $i_1'$ and $i_2'$ do not have to flow through an emitter bond wire inductance $L_{BWE2}$ or a ground trace inductance $L_{GT2}$ as do currents $i_1$ and $i_2$ in FIG. 4.

Additional ground return inductance from the parasitic ground wire inductance $L_{GW}$ is substantially cancelled by a mutual inductance formed on the integrated circuit layout between the ground wire routing and the input wire routing and from the same ground loop current flowing in opposite directions within them. Each of the ground wire inductances $L_{GW}$ is substantially canceled by the mutual inductance formed with the respective input wire inductance $L_{IW}$. For example in FIG. 6, consider the input wire inductance $L_{IW3}'$ (ignoring the base inductance $L_B$ because it is not substantial) and the ground wire inductance $L_{GW3}$ of amplifier stage 3 where the ground loop current $i_2'$ flows. The well know transformer equation for mutual inductance M is given by $$M = k\sqrt{L_1 L_2} \quad \text{(EQ. 4)}.$$

where k's value for the magnetic coupling efficiency of the mutual induction ranges from 1 to 0. The ground wire routing and the input wire routing are substantially similar providing substantially similar values of parasitic inductances such that $L_{GW3}=L_{IW3}'$. Additionally, the ground wire routing of the cascaded ground bus and the input wire routing are substantially magnetically coupled together such that the efficiency $k \approx 1$. Substituting these values into EQ. 4 for M we see $$M \approx 1 \times \sqrt{L_{GW3} \times L_{IW3}'} = \sqrt{L_{GW3} \times L_{GW3}} = L_{GW3} \quad \text{(EQ. 5)}.$$

Now the ground return inductance $L_{return}$ for amplifier A3' is found from the equation $$L_{return3} \approx L_{GW3} - M \quad \text{(EQ. 6)}.$$

where M is the mutual inductance.
Substituting the value computed above for the mutual inductance M into EQ. 6, it can be seen that the ground return inductance equation becomes $$L_{return3} \approx L_{GW3} - L_{GW3} = 0 \quad \text{(EQ. 7)}.$$

This illustrates how the mutual inductance substantially cancels the remaining part of the ground return inductance except for the emitter inductance $L_{E3}$ from the connection to the cascaded ground bus which is substantially negligible and whose effects are minimized by splitting the ground current loops on the integrated circuit chip. Each stage of the cascaded amplifier provides a similar cancellation of their respective ground wire inductance $L_{GW}$ and input wire inductance $L_{IW}$. With the ground return inductance $L_{return}$ and the emitter inductance $L_{emitter}$ substantially having the values of zero, the equation for amplifier power $A_p$ is maximized to approach the idealized intrinsic gain provided by the transistor within each amplifier stage. With each amplifier stage having its gain maximized, the overall efficiency of the IC cascaded amplifier 500 is maximized as well.

Figure 7:
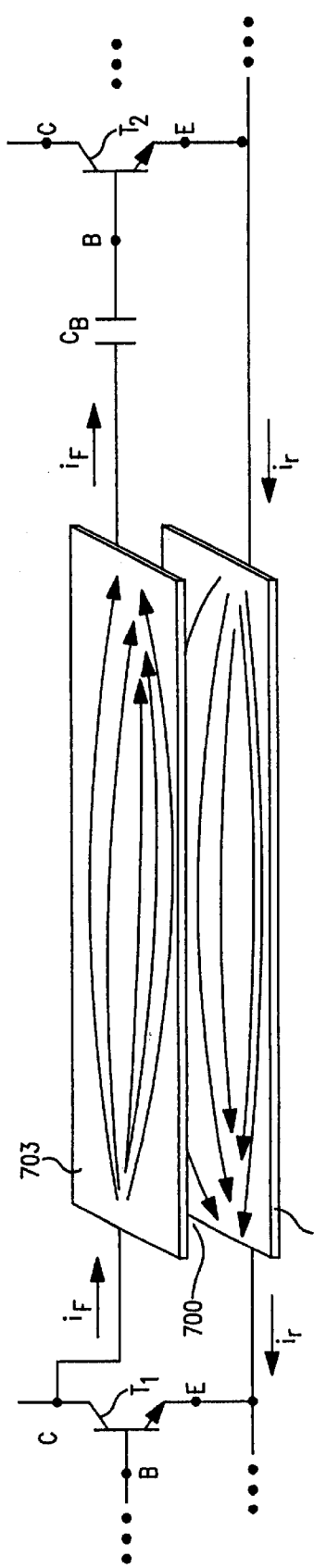
FIG. 7 is perspective view of an exemplary layout of the input wire and ground wire between two amplifier stages providing magnetic coupling there-between for the cascaded ground of the present invention.

Referring now to FIG. 7, a perspective view of an simplified layout for the input wire routing and ground wire routing between transitor T1 and T2 of amplifier stages is illustrated. In the preferred embodiment there are three layers of metal used for routing signal lines with the mutual inductance being formed between wire routing on metal layer one and wire routing on metal layer three. In FIG. 7, the mutual inductance is formed between metal wire routing 701 and metal layer wire routing 703. Separating these layers to keep them from shorting is a dielectric 700 preferably an oxide that is grown on top of the lower level metal layers during manufacturing. The lay out of the wire routing 701 and 703 are nearly identical but on different layers to be substantially in parallel for providing the magnetic coupling. The surface area of wire routing 701 and wire routing 703 are relatively large to provide increased magnetic coupling between the input wire routing and the ground wire routing. The relatively large surface area of the wire routing 701 and wire routing 703 also decreases the inductance of the wire routing itself. Metal wire routing 701 forms the ground bus between each stage connecting to each emitter of the transistors in the cascaded amplifer through which a reverse current $i_r$ flows. Metal wire routing 703 connects the collector of a previous stage (or the input to the first stage) to the blocking capacitor $C_B$ which couples to the base of the next stage (or the base of the first stage) through which a forward current $i_f$ flows. Each stage of the cascaded amplifier are similarly routed so that substancial mutual inductance is formed between the signal wire routing (input signal wire routing in the first to next to last stage and output wire routing of the last stage) and the ground wire routing.

Figure 8:
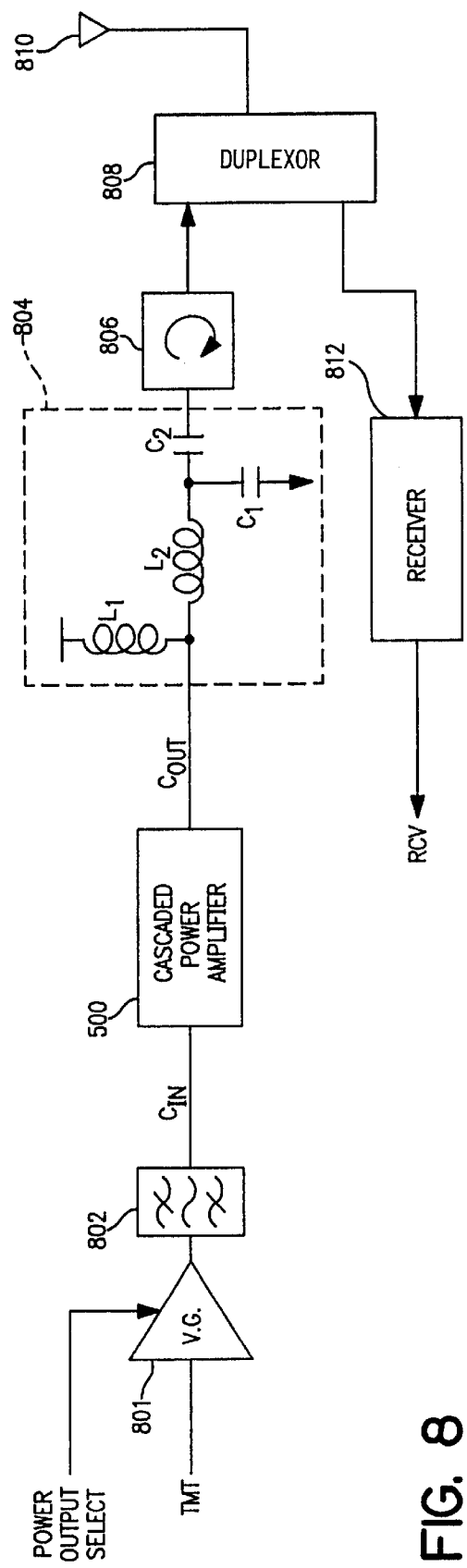
FIG. 8 is a block diagram of an exemplary application of the IC cascaded amplifier with the cascaded ground of the present invention.

Referring now to FIG. 8, a typical circuit illustrating a typical application of the present invention is illustrated. A transceiver utilizes the integrated circuit cascaded ground amplifier 500 to amplify signals. A signal for transmission TMT is input into a variable gain amplifier VG 801. The gain is varied by the power output select signal in order to transmit using a desired power output level. The output from the variable gain amplifier VG 801 is input into a surface acoustical wave filer SAW 802. The output from the SAW filter 802 is input into the cascaded power amplifier 500 as the Cin signal. The output of the cascaded power amplifier 500 is coupled to a reactance matching network 804 (inductors L1 and L2 with capacitors C1 and C2). The reactance matching network 804 matches a reactance of approximately fifty ohms to a reactance of the output impedance of the cascaded power amplifier 500. This allows the low impedance output of the cascaded power amplifier 500 to provide a a higher voltage swing to the antenna 810 at a low current level. An isolator 806 is coupled to the output from the reactance matching network 804 to keep power from being reflected back to the cascaded power amplifier 500. The isolator 806 has a high return loss so as to keep the output impedance of the amplifier 500 substantially constant. The output of the isolator is coupled to the duplexer 808 for the transmitted signal and its power spectrum to be coupled into the antenna 810. The duplexer 808 splits the received signal off from the antenna 810 and directs it towards the receiver 812. The duplexer couples to the antenna 810. The receiver 812 may also use a cascaded power amplifier 500 of the present invention. The present invention can be used in an integrated circuit dedicated to providing a cascaded amplifier or a more complex integrated circuit which integrates the cascaded power amplifier of the present invention with other circuitry. In either case, the cascaded ground bus is implemented between two VSS pins 501 and 502.

The present invention has many advantages over the prior art. One advantage of the present invention is that ground loop currents are split on the integrated circuit chip at the connection to the cascaded ground bus thereby minimizing the common ground inductance. Another advantage of the present invention is that only two board ground connections are required thereby saving pins for other functions. Still another advantage of the present invention is that the input inductance and the ground wire routing inductance are substantially magnetically coupled such that the parasitic inductance in the ground bus is effectively cancelled. One of ordinary skill will see further advantages to the present invention over the prior art after reading through the disclosure.

The preferred embodiments of the present invention for are thus described. While the present invention has been described in particular embodiments, the present invention should not be construed as limited by such embodiments, but rather construed according to the claims that follow below.

What is claimed is:

1. An integrated circuit (IC) including a cascaded amplifier, the cascaded amplifier comprising:

a first IC amplifier to amplify an input signal into an output signal, the first IC amplifier having a first amplifier input terminal and a first amplifier ground terminal;

a first input wire route coupled to the amplifier input terminal to couple the input signal into the amplifier, the first input wire route having a first input wire inductance; and a first ground wire route coupled to the first amplifier ground terminal, the first ground wire route having a first ground wire inductance, the first ground wire inductance being magnetically coupled to the first input wire inductance to form a first mutual inductance to substantially cancel the effects of the first ground wire inductance to use power efficiently in the first IC amplifier.

2. An integrated circuit (IC) including a cascaded amplifier, the cascaded amplifier comprising:
  a first IC amplifier to amplify an input signal into an output signal, the first IC amplifier having a first amplifier input terminal and a first amplifier ground terminal;
  a first input wire route coupled to the amplifier input terminal to couple the input signal into the amplifier, the first input wire route having a first input wire inductance;
  a first ground wire route coupled to the first amplifier ground terminal, the first ground wire route having a first ground wire inductance, the first ground wire inductance being magnetically coupled to the first input wire inductance to form a first mutual inductance to substantially cancel the effects of the first ground wire inductance to use power efficiently in the first IC amplifier;
  a second IC amplifier to couple to the first IC amplifier to amplify the output of the first amplifier into another output signal, the second IC amplifier having a second amplifier input terminal and a second amplifier ground terminal;
  a second input wire route coupled between the output of the first IC amplifier and the second amplifier input terminal to couple the output signal from the first IC amplifier into the input of the second IC amplifier, the second input wire route having a second input wire inductance; and
  a second ground wire route coupled to the first ground wire route and to the second amplifier ground terminal, the second ground wire route having a second ground wire inductance, the second ground wire inductance being magnetically coupled to the second input wire inductance to form a second mutual inductance to substantially cancel the effects of the second ground wire inductance to use power efficiently in the second IC amplifier.

3. An integrated circuit (IC) including a cascaded amplifier, the cascaded amplifier comprising:
  a first IC amplifier to amplify an input signal into an output signal, the first IC amplifier having a first amplifier input terminal and a first amplifier ground terminal, the first IC amplifier includes,
    a gain element having an input terminal, a ground terminal and an output terminal, the gain element to amplify an input signal on the input terminal into an output signal on the output terminal, and
    an inductor coupled between the output terminal of the gain element and a high level voltage power supply terminal of the IC amplifier;
  a first input wire route coupled to the amplifier input terminal to couple the input signal into the amplifier, the first input wire route having a first input wire inductance; and
  a first ground wire route coupled to the first amplifier ground terminal, the first ground wire route having a first ground wire inductance, the first ground wire inductance being magnetically coupled to the first input wire inductance to form a first mutual inductance to substantially cancel the effects of the first ground wire inductance to use power efficiently in the first IC amplifier.

4. The integrated circuit (IC) of claim 3 including a cascaded amplifier, wherein the gain element is a bipolar junction transistor respectively having a base, emitter and collector as the input terminal, a ground terminal and an output terminal and the first IC amplifier further includes,
  a bias circuit to couple a bias voltage to a base of the bipolar junction transistor, and
  a blocking capacitor coupled between the base of the bipolar junction transistor and the first amplifier input terminal.

5. An integrated circuit (IC) including a cascaded amplifier, the cascaded amplifier comprising:
  a first IC amplifier to amplify an input signal into an output signal, the first IC amplifier having a first amplifier input terminal and a first amplifier ground terminal;
  a first input wire route coupled to the amplifier input terminal to couple the input signal into the amplifier, the first input wire route having a first input wire inductance;
  a first ground wire route is coupled to the first amplifier ground terminal at one end and a low level voltage power supply at the opposite end, the first ground wire route having a first ground wire inductance, the first ground wire inductance being magnetically coupled to the first input wire inductance to form a first mutual inductance to substantially cancel the effects of the first ground wire inductance to use power efficiently in the first IC amplifier; and
  a second ground wire route coupled to the first amplifier ground terminal at one end and the low level voltage power supply at the opposite end, the second ground wire route having a second ground wire inductance, the second ground wire inductance being magnetically coupled to an output wire inductance of an output wire coupled to a first amplifier output terminal to form a second mutual inductance and the same ground current flows through the second ground wire inductance and the output wire inductance but in opposite directions to substantially cancel the effects of the second ground wire inductance in order to use power efficiently in the first IC amplifier.

6. The integrated circuit (IC) of claim 5 including a cascaded amplifier, wherein a ground loop current flowing through the first amplifier ground terminal is split to flow to the low level voltage power supply through the first ground wire route and to flow through to the low level voltage power supply through the second ground wire route to use power efficiently in the first IC amplifier.

7. The integrated circuit (IC) of claim 1 including a cascaded amplifier, wherein the first ground wire route and the first input wire route substantially overlap each other in parallel to magnetically couple and form a mutual inductance between the first ground wire inductance and the first input wire inductance to substantially negate the effects of the first ground wire inductance.

8. The integrated circuit (IC) of claim 2 including a cascaded amplifier, wherein
  the first ground wire route and the first input wire route substantially overlap each other in parallel to magnetically couple and form a mutual inductance between the first ground wire inductance and the first input wire inductance to substantially negate the effects of the first ground wire inductance, and the second ground wire route and the second input wire route substantially overlap each other in parallel to magnetically couple and form a mutual inductance between the second ground wire inductance and the second input wire inductance to substantially negate the effects of the second ground wire inductance.

9. The integrated circuit (IC) of claim 2 including a cascaded amplifier, the cascaded amplifier further comprising:
an output wire route coupled between the output of the second IC amplifier and an output of the IC cascaded ground return amplifier to couple the output signal from the first IC amplifier into the output of the IC cascaded ground return amplifier, the output wire route having an output wire inductance; and
a third ground wire route coupled to the second ground wire route and to the second amplifier ground terminal at one end and the low level voltage power supply at an opposite end, the third ground wire route having a third ground wire inductance, the third ground wire inductance being magnetically coupled to the output wire inductance to form a third mutual inductance to substantially cancel the effects of the third ground wire inductance in order to use power efficiently in the second IC amplifier.

10. The integrated circuit (IC) of claim 9 including a cascaded amplifier, wherein
the first ground wire route and the first input wire route substantially overlap each other in parallel to magnetically couple and form a mutual inductance between the first ground wire inductance and the first input wire inductance to substantially negate the effects of the first ground wire inductance,
the second ground wire route and the second input wire route substantially overlap each other in parallel to magnetically couple and form a mutual inductance between the second ground wire inductance and the second input wire inductance to substantially negate the effects of the second ground wire inductance, and
the third ground wire route and the output wire route substantially overlap each other in parallel to magnetically couple and form a mutual inductance between the third ground wire inductance and the output wire inductance to substantially negate the effects of the third ground wire inductance.

11. The integrated circuit (IC) of claim 3 including a cascaded amplifier, wherein the gain element is a field effect transistor respectively having a gate, source and drain as the input terminal, the ground terminal and the output terminal.

12. The integrated circuit (IC) of claim 11 including a cascaded amplifier, wherein the field effect transistor is a junction field effect transistor (JFET).

13. The integrated circuit (IC) of claim 11 including a cascaded amplifier, wherein the field effect transistor is a metal semiconductor field effect transistor (MESFET).

14. The integrated circuit (IC) of claim 11 including a cascaded amplifier, wherein the field effect transistor is a metal oxide semiconductor field effect transistor (MOSFET).

15. The integrated circuit (IC) of claim 11 including a cascaded amplifier, wherein the field effect transistor is an N-type field effect transistor (NFET).

16. The integrated circuit (IC) of claim 11 including a cascaded amplifier, wherein the field effect transistor is a P-type field effect transistor (PFET).

17. An integrated circuit (IC) including a signal amplifier the IC comprising:

a plurality of IC amplifier stages coupled in series to amplify an input signal into an output signal, each of the plurality of IC amplifier stages having an input terminal, an output terminal and an amplifier ground terminal;
a cascaded ground bus within the IC, the cascaded ground bus having a pair of ground terminals at opposite ends to couple to a low level voltage supply; and
each of the plurality of IC amplifier stages having their respective amplifier ground terminal coupled to the cascaded ground bus between the pair of ground terminals so as to split a ground current through the amplifier ground terminal of each respective IC amplifier stage between the pair of ground terminals of the cascaded ground bus.

18. The integrated circuit (IC) of claim 17 including the signal amplifier, the IC further comprising:
a series of signal wire routes to couple to each input terminal and each output terminal of the plurality of IC amplifier stages to couple them in series together, each of the series of signal wire routes having a signal wire inductance, and
wherein the cascaded ground bus within the IC is parallel to and substantially overlaps the series of signal wire routes to magnetically couple and form a mutual inductance between them, the cascaded ground bus having a ground return inductance, the mutual inductance formed to substantially negate the effects of the ground return inductance.

19. The integrated circuit (IC) of claim 17 including the signal amplifier, wherein each of the plurality of IC amplifier stages includes,
a gain element having a control terminal coupled to the input terminal, a first terminal coupled to the amplifier ground terminal and a second terminal coupled to the amplifier output terminal, the gain element to amplify an input signal on the control terminal into an output signal between the second terminal and the first terminal, and
an inductor coupled between the second terminal of the gain element and a high level voltage power supply terminal.

20. The integrated circuit (IC) of claim 19 including the signal amplifier, wherein
the gain element is a bipolar junction transistor with the first terminal being the emitter, the second terminal being the collector, and the control terminal being the base, and
wherein each of the plurality of IC amplifier stages further includes,
a bias circuit to couple a bias voltage to the base of the bipolar junction transistor, and
a blocking capacitor coupled between the base of the bipolar junction transistor and the input terminal of the amplifier stage.

21. An integrated circuit (IC) including a signal amplifier, the IC comprising:
a plurality of IC amplifier stages coupled in series to amplify an input signal into an output signal, each of the plurality of IC amplifier stages having an input terminal, an output terminal and an amplifier ground terminal;
a cascaded ground bus within the IC, the cascaded ground bus having a pair of ground terminals at opposite ends to couple to a low level voltage supply;

each of the plurality of IC amplifier stages having their respective amplifier ground terminal coupled to the cascaded ground bus between the pair of ground terminals so as to split a ground current through the amplifier ground terminal of each respective IC amplifier stage between the pair of ground terminals of the cascaded ground bus; and wherein the IC is a communications integrated circuit and the signal amplifier is a power amplifier to transmit signals through an antenna.

22. A method of increasing amplifier gain and power efficiency of a cascaded power amplifier, the method comprising:

a) forming a plurality of amplifier stages coupled together in series as a cascaded power amplifier on an integrated circuit;

b) routing a ground wire on the integrated circuit from a first ground terminal to a second ground terminal; and c) coupling an amplifier ground terminal of each of the plurality of amplifier stages to the ground wire between the first ground terminal and the second ground terminal in the order of the coupling together in series to split the ground current through the amplifier ground terminal between the first ground terminal and the second ground terminal.

23. A method of increasing amplifier gain and power efficiency of a cascaded power amplifier, the method comprising:

a) forming a plurality of amplifier stages coupled together in series as a cascaded power amplifier on an integrated circuit;

b) routing a ground wire on the integrated circuit from a first ground terminal to a second ground terminal; and c) coupling an amplifier ground terminal of each of the plurality of amplifier stages to the ground wire between the first ground terminal and the second ground terminal in the order of the coupling together in series to split the ground current through the amplifier ground terminal between the first ground terminal and the second ground terminal; and d) routing an input wire from one amplifier stage to the next amplifier stage of the plurality of amplifier stages coupled together in series, the routing of the input wire substantially overlapping and in parallel with the ground wire forming a mutual inductance there between to substantially negate effects of a parasitic inductance of the ground wire.

24. The method of claim 22 of increasing amplifier gain and power efficiency of a cascaded power amplifier, wherein, the plurality of amplifier stages are bipolar junction transistor amplifiers and the method further comprises:

e) biasing a base of the bipolar junction transistor amplifiers; and g) forming a blocking capacitor between the base of the bipolar junction transistor and a signal input of the plurality of amplifier stages.

25. The method of claim 24 of increasing amplifier gain and power efficiency of a cascaded power amplifier, wherein, the forming a blocking capacitor between the base of the bipolar junction transistor and a signal input of the plurality of amplifier stages forms separate signal routing each having its own parasitic inductance.

26. The integrated circuit (IC) of claim 21 including the signal amplifier, the IC further comprising:

a series of signal wire routes to couple to each input terminal and each output terminal of the plurality of IC amplifier stages to couple them in series together, each of the series of signal wire routes having a signal wire inductance, and wherein the cascaded ground bus within the IC is parallel to and substantially overlaps the series of signal wire routes to magnetically couple and form a mutual inductance between them, the cascaded ground bus having a ground return inductance, the mutual inductance formed to substantially negate the effects of the ground return inductance.

27. The integrated circuit (IC) of claim 21 including the signal amplifier, wherein each of the plurality of IC amplifier stages includes, a gain element having a control terminal coupled to the input terminal, a first terminal coupled to the amplifier ground terminal and a second terminal coupled to the amplifier output terminal, the gain element to amplify an input signal on the control terminal into an output signal between the second terminal and the first terminal, and an inductor coupled between the second terminal of the gain element and a high level voltage power supply terminal.

28. The integrated circuit (IC) of claim 27 including the signal amplifier, wherein the gain element is a bipolar junction transistor with the first terminal being the emitter, the second terminal being the collector, and the control terminal being the base, and wherein each of the plurality of IC amplifier stages further includes, a bias circuit to couple a bias voltage to the base of the bipolar junction transistor, and a blocking capacitor coupled between the base of the bipolar junction transistor and the input terminal of the amplifier stage.

29. The method of claim 23 of increasing amplifier gain and power efficiency of a cascaded power amplifier, wherein, the plurality of amplifier stages are bipolar junction transistor amplifiers and the method further comprises:

e) biasing a base of the bipolar junction transistor amplifiers; and g) forming a blocking capacitor between the base of the bipolar junction transistor and a signal input of the plurality of amplifier stages.

30. The method of claim 29 of increasing amplifier gain and power efficiency of a cascaded power amplifier, wherein, the forming a blocking capacitor between the base of the bipolar junction transistor and a signal input of the plurality of amplifier stages forms separate signal routing each having its own parasitic inductance.

31. An integrated circuit (IC) comprising:

a plurality of IC amplifier stages coupled in series to amplify an input signal into an output signal, each of the plurality of IC amplifier stages having an input terminal, an output terminal and an amplifier ground terminal, a series of signal wire routes to couple to each input terminal and each output terminal of the plurality of IC amplifier stages, each of the series of signal wire routes having a signal wire inductance;

a cascaded ground bus within the IC, the cascaded ground bus having a pair of ground terminals at opposite ends to couple to a low level voltage supply, the cascaded ground bus within the IC parallel to and substantially overlapping the series of signal wire routes to magnetically couple and form a mutual inductance between them, the cascaded ground bus having a ground return inductance, the mutual inductance formed to substantially negate the effects of the ground return inductance; and each of the plurality of IC amplifier stages having their respective amplifier ground terminal coupled to the cascaded ground bus between the pair of ground terminals so as to split a ground current through the amplifier ground terminal of each respective IC amplifier stage between the pair of ground terminals of the cascaded ground bus.

32. The integrated circuit (IC) of claim 31, wherein, each of the plurality of IC amplifier stages includes, a gain element having a control terminal coupled to the input terminal, a first terminal coupled to the amplifier ground terminal and a second terminal coupled to the amplifier output terminal, the gain element to amplify an input signal on the control terminal into an output signal between the second terminal and the first terminal, and an inductor coupled between the second terminal of the gain element and a high level voltage power supply terminal.

33. The integrated circuit (IC) of claim 32, wherein, the gain element is a bipolar junction transistor with the first terminal being the emitter, the second terminal being the collector, and the control terminal being the base, and wherein each of the plurality of IC amplifier stages further includes, a bias circuit to couple a bias voltage to the base of the bipolar junction transistor, and a blocking capacitor coupled between the base of the bipolar junction transistor and the input terminal of the amplifier stage.

34. An integrated circuit (IC) comprising:

a cascaded amplifier including series amplifying means to amplify an input signal into an output signal, signal wire route means to couple a plurality of IC amplifier stages in series, the signal wire route means having a signal wire inductance; and ground wire route means coupled to the first amplifier ground terminal, the ground wire route means having a ground wire inductance, the ground wire inductance magnetically coupled to the signal wire inductance to form a mutual inductance to substantially cancel effects of the ground wire inductance.

35. The integrated circuit (IC) of claim 34, wherein, the ground wire route means and the signal wire route means substantially overlap each other in parallel to magnetically couple and form the mutual inductance between the ground wire inductance and the signal wire inductance.

* * * * *